(12) United States Patent
Chan et al.

(10) Patent No.: US 6,541,327 B1
(45) Date of Patent: Apr. 1, 2003

(54) METHOD TO FORM SELF-ALIGNED SOURCE/DRAIN CMOS DEVICE ON INSULATED STAIRCASE OXIDE

(75) Inventors: Lap Chan, San Francisco, CA (US); Elgin Quek, Singapore (SG); Ravi Sundaresan, San Jose, CA (US); Yang Pan, Singapore (SG); James Yong Meng Lee, Singapore (SG); Ying Keung Leung, Hong Kong (HK); Yelehanka Ramachandramurthy Pradeep, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/760,123

(22) Filed: Jan. 16, 2001

(51) Int. Cl.[7] .......................................... H01L 21/8238
(52) U.S. Cl. ...................... 438/229; 438/300; 438/301; 438/305
(58) Field of Search ................................ 438/229, 300, 438/301, 305

(56) References Cited

U.S. PATENT DOCUMENTS

| | | | |
|---|---|---|---|
| 4,916,084 A | 4/1990 | Shibata et al. | 437/41 |
| 5,422,289 A | 6/1995 | Pierce | 437/32 |
| 5,597,746 A | * 1/1997 | Prall | 437/416 |
| 5,683,924 A | * 11/1997 | Chan et al. | 437/44 |
| 6,015,727 A | 1/2000 | Wamlass | 438/218 |
| 6,107,145 A | 8/2000 | Dennison et al. | 438/297 |
| 6,110,790 A | 8/2000 | Chen | 438/305 |
| 6,162,694 A | * 12/2000 | Cheek et al. | 438/305 |

FOREIGN PATENT DOCUMENTS

| | | | |
|---|---|---|---|
| EP | 0747946 A2 | 12/1996 | H01L/21/762 |
| WO | WO 01/18873 A1 | 3/2001 | |

OTHER PUBLICATIONS

Fitch et al., "Structure for Reduced Source and Drain Area by Selective Silicon," Motorola Technical Developments, Motorola Inc. Schaumburg, Ill., U.S., vol. 14, pp. 93–95, Dec. 1, 1991, XP000276195.

* cited by examiner

Primary Examiner—Olik Chaudhuri
Assistant Examiner—Khiem Nguyen
(74) Attorney, Agent, or Firm—George O. Saile; Rosemary L. S. Pike; William J. Stoffel

(57) ABSTRACT

A method to form elevated source/drain (S/D) over staircase shaped openings in insulating layers. A gate structure is formed over a substrate. The gate structure is preferably comprised of a gate dielectric layer, gate electrode, first spacers, and hard mask. A first insulating layer is formed over the substrate and the gate structure. A resist layer is formed having an opening over the gate structure and over a lateral area adjacent to the gate structure. We etch the insulating layer through the opening in the resist layer. The etching removes a first thickness of the insulating layer to form a source/drain (S/D) opening. We remove the first spacers and hardmask to form a source/drain (S/D) contact opening. We implant ions into the substrate through the source/drain (S/D) contact opening to form lightly doped drain regions. We form second spacers on the sidewalls of the gate electrode and the gate dielectric and on the sidewalls of the insulating layer in the source/drain (S/D) contact opening and the source/drain (S/D) opening. A conductive layer is deposited over the gate electrode, the insulating layer. The conductive layer is planarized to exposed the insulating layer to form elevated source/drain (S/D) blocks on a staircase shape insulating layer.

9 Claims, 4 Drawing Sheets

METHOD TO FORM SELF-ALIGNED SOURCE/DRAIN CMOS DEVICE ON INSULATED STAIRCASE OXIDE

BACKGROUND OF INVENTION

1) Field of the Invention

This invention relates generally to fabrication of semiconductor devices and more particularly to the fabrication elevated source/drain regions on a staircase shaped insulating layer.

2) Description of the Prior Art

Field effect transistors (FETs) are comprised of a pair of diffusion regions, referred to as a source and a drain, spaced apart within a semiconductive substrate. Such include a gate provided adjacent the separation region and between the diffusion regions for imparting an electric field to enable current to flow between the diffusion regions. The substrate area adjacent the gate and between the diffusion regions is referred to as the channel. The semiconductive substrate typically comprises a bulk monocrystalline silicon substrate having a light conductivity dopant impurity concentration. Alternately, the substrate can be provided in the form of a thin layer of lightly doped semiconductive material over an underlying insulating layer. Such are commonly referred to as semiconductor-on-insulator (SOI) constructions.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths greater than 2 microns) to short-channel devices (i.e., channel lengths less than 0.5 microns).

As field effect transistor channel lengths (i.e., gate widths) became smaller, so-called short channel effects began to become increasingly significant. As a result, device design and consequently process technology had to be modified to take these effects into account so that optimum device performance could continue to be obtained. For example, as device dimensions are reduced and the supply voltage remains constant, the lateral electric field generated within the substrate increases. If the field becomes strong enough, it can give rise to so-called hot-carrier effects. This becomes a significant problem with channel lengths smaller than 0.5 microns. Hot-carrier effects cause unacceptable performance degradation in n-type transistor devices built with conventional drain structures if their channel lengths are less than 0.5 microns.

A preferred method of overcoming this problem is to provide lightly doped drain (LDD) regions within the substrate relative to the channel region in advance of the source and drain regions. The LDD regions are provided to be lighter conductively doped (i.e., less concentration) than the source and drain regions. This facilitates sharing of the voltage drop by the drain in the channel, as opposed to the stark voltage drop at the channel occurring in non-LDD n-type transistors. The LDD regions absorb some of the voltage drop potential into the drain, thus effectively eliminating hot carrier effects. As a result, the stability of the device is increased.

However, further shrinking of the gate width (i.e., shorter channel length) makes the LDD region of a conventional transistor less effective. For example, shorter channel lengths require the LDD length to be reduced to ensure sufficient semiconductive material between the diffusion regions to prevent conductance when the gate voltage is off. One way of attending to such problems is to displace the predominant portion of the source and drain regions outwardly away from the substrate by elevating them. For example, a thin (e.g., 200-nm) epitaxial layer of monocrystalline silicon can be selectively grown from an exposed monocrystalline source and drain substrate areas within an epi reactor, and provided with sufficiently high conductivity doping to effectively provide source and drain regions. The lighter doped LDD regions can be provided within the substrate immediately below the elevated source and drain. Thus, a channel of sufficient length is effectively provided despite the smaller width gate.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,597,746 (Prall) that shows a FET with elevated S/D.

U.S. Pat. No. 5,683,924 (Chan et al. ) shows a raised S/D process.

U.S. Pat. No. 5,422,289 (Pierce) shows another raised poly S/D process.

U.S. Pat. No. 6,015,727 (Wanlass) teaches a damascene S/D process.

SUMMARY OF THE INVENTION

It is an object-of the present invention to provide a method for fabricating an elevated source/drain (S/D).

It is an object of the present invention to provide a method for fabricating an elevated source/drain (S/D) on a staircase shaped insulating layer.

To accomplish the above objectives, the present invention provides a method for fabricating a elevated source/drain (S/D) on a staircase shaped insulating layer. The invention has two preferred embodiments.

The first preferred embodiment can be described as follows. A gate structure is formed over a substrate. The gate structure is preferably comprised of a gate dielectric layer, gate electrode, first spacers, and.hard mask. A first insulating layer is formed over the substrate and the gate structure. A resist layer is formed having an opening over the gate structure and over a lateral area adjacent to the gate structure. We etch the insulating layer through the opening in the resist layer. The etching removes a first thickness of the insulating layer to form a source/drain (S/D) opening. We remove the first spacers and hardmask to form a source /drain (S/D) contact opening. We implant ions into the substrate through the source/drain (S/D) contact opening to form lightly doped drain regions. We form second spacers on the sidewalls of the gate electrode and the gate dielectric and on the sidewalls of the insulating layer in the source/drain (S/D) contact opening and the source/drain (S/D) opening. A conductive layer is deposited over the gate electrode, the insulating layer. The conductive layer is planarized to exposed the insulating layer to form elevated source/drain (S/D) blocks on a staircase shape insulating layer.

The second preferred embodiment is described as follows. An insulating layer having a staircase shaped opening is formed over the substrate. The staircase shaped opening comprised of a lower opening and an upper opening. Next, A gate dielectric layer and gate electrode layer are formed over the substrate filling the a staircase shaped opening. We pattern the gate dielectric layer and gate electrode layer to form a gate dielectric and gate electrode. Then ions are implanted into the substrate through said staircase opening to form LDD regions 128. Gate spacers are formed on the sidewalls of the gate electrode and insulating layer spacers on the sidewalls of the insulating layer in the staircase shaped opening . We form elevated source/drain (S/D) blocks in the staircase shaped opening. Ions are implanted into the elevated source drain (S/D) blocks to dope the elevated source drain (S/D) blocks. Silicide regions are formed on the gate and the elevated source/drain (S/D) blocks.

The invention has many advantages over the conventional method to form Source/drains. The invention reduces parasitic junction capacitance. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A. First Embodiment

The first embodiment of the invention is shown in FIGS. 1 to 8.

Figure 1:
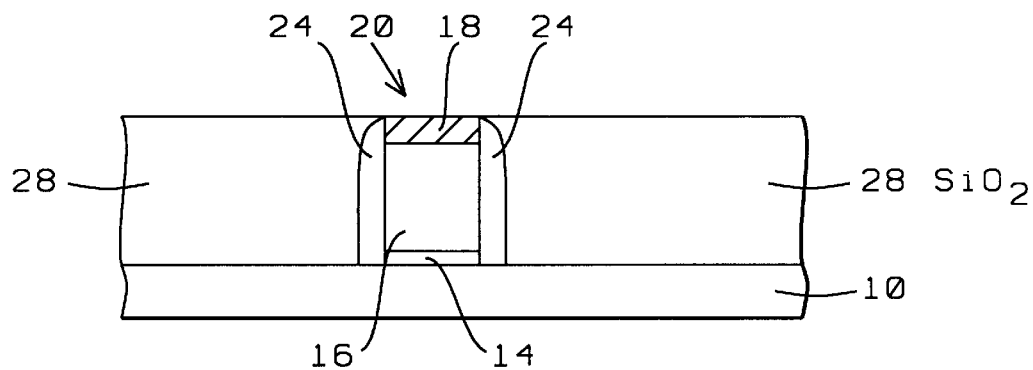
FIGS. 1 through 8 are cross sectional views for illustrating a first preferred embodiment of a method for forming elevated source/drain (S/D) regions in a staircase shaped opening in an insulating layer.

As shown in FIG. 1 gate structure is formed over a substrate. The gate structure is preferably comprised of a gate dielectric layer 14, gate electrode 16, first spacers 24, and hard mask 18.

The first spacers 24 and the hard mask 18 are comprised of silicon nitride or silicon oxynitride. The first spacers 24 preferably have a thickness of between about 2000 and 4000 Å. Silicon nitride is preferred for easier removal by Hot Phosphoric acid.

As shown in FIG. 1, we form a first insulating layer 28 over the substrate 10. Preferably, the first insulating layer 28 is formed over the substrate 10 and gate structure. Then, the first insulating layer 28 is chemical-mechanical polish (CMP) to be coplanar with the top of the gate structure. The first insulating layer 28 is preferably comprised of oxide, or other low K materials with K less than 3.0 (e.g., Fluorine silicate glass (FSG), etc). The first insulating layer 28 preferably has a thickness of between about 1500 and 4000 Å.

Figure 2:
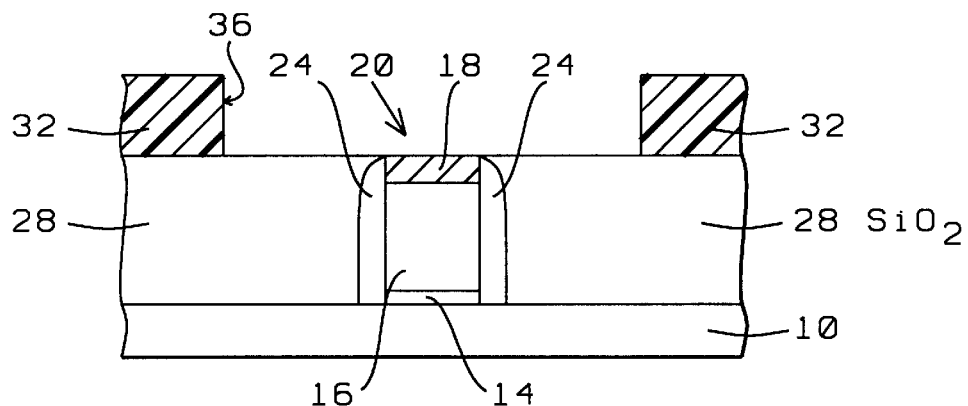

As shown in FIG. 2, we form a resist layer 32 having an opening 36 over the gate structure 20 and over a lateral area adjacent to the gate structure 20.

Figure 3:
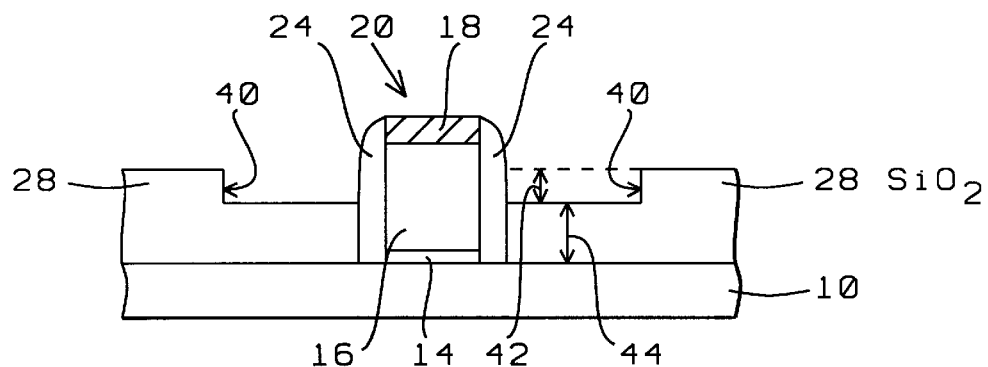

As shown in FIG. 3, a first thickness 42 of the insulating layer 28 is etched through the opening 36 and to form a source/drain (S/D) opening 40. The first thickness 42 of the insulating layer that is removed is preferably between 500 and 1000 Å.

The resist layer is removed.

In an optional step, a blanket etch back (e.g., optional oxide etch back step) is performed to reduce the thickness of the first insulating layer 28.

As shown in FIG. 3, the thickness 44 is preferably between 500 and 3000 Å and thickness 42 is preferably between 500 and 1000 Å and the total thickness of layer 28 (44 plus 42) is preferably between 2000 and 4000 Å.

Figure 4:
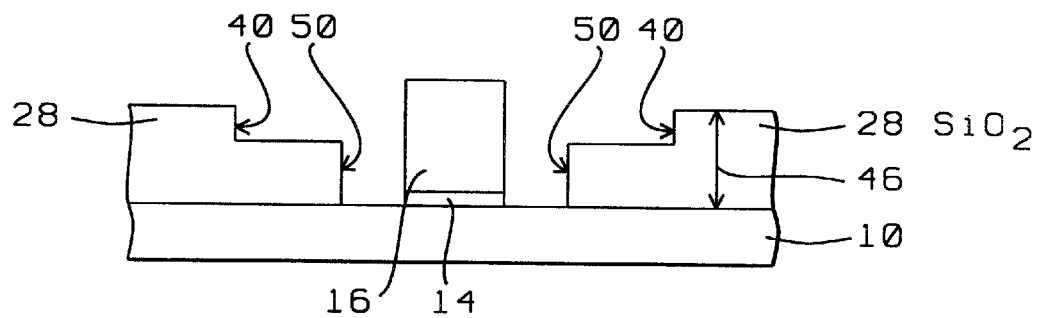

As shown in FIG. 4, we remove the first spacers 24 to form a source/drain (S/D) contact opening 50. Preferably the insulating layer 24 has a thickness of between about 1500 and 2000 Å.

Figure 5:
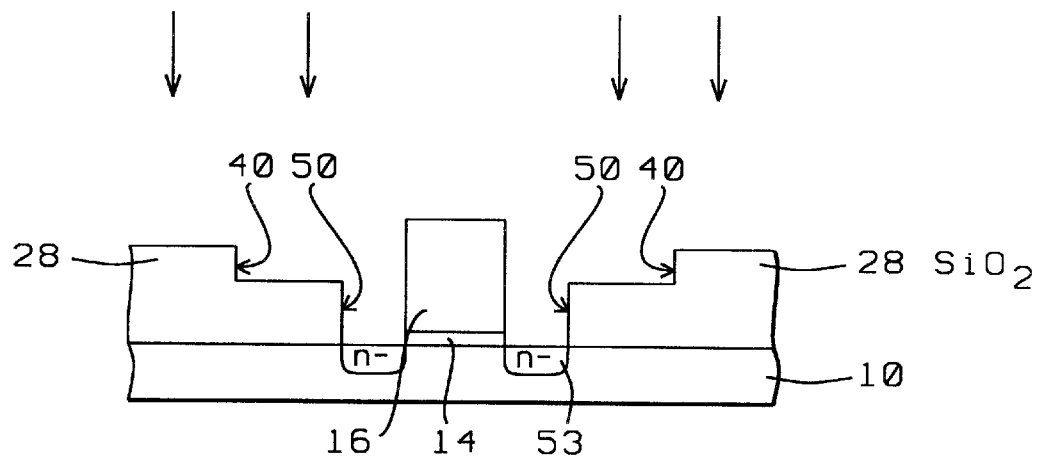

As shown in FIG. 5, we implant ions into the substrate through the source/drain (S/D) contact opening 50 to form lightly doped drain regions 53.

Figure 6:
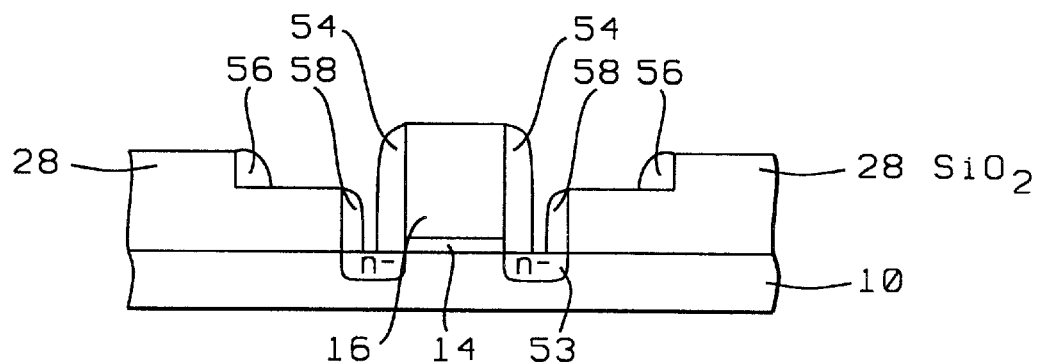

As shown in FIG. 6, we form second spacers 54 56 58 on the sidewalls of the gate electrode 16 and the gate dielectric 14 and on the sidewalls of the insulating layer 28 in the source/drain (S/D) contact opening 50 and the source/drain (S/D) opening 40. The second spacers 54 56 58 are preferably comprise of silicon oxide or silicon nitride and preferably have a thickness of between about 500 and 1000 Å.

Figure 7:
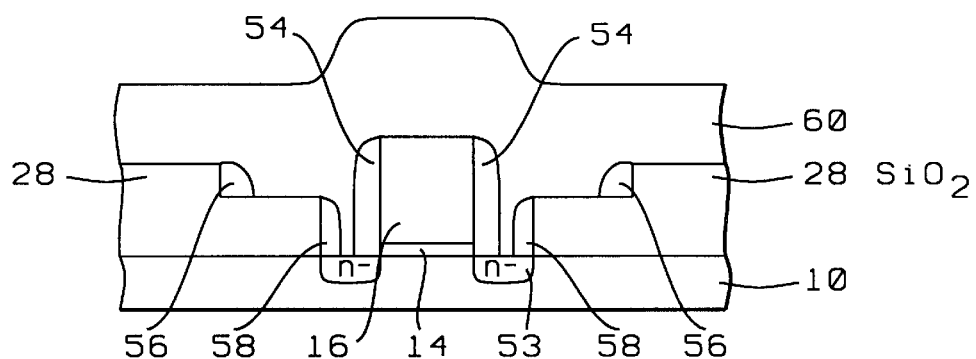

As shown in FIG. 7, a conductive layer 60 is deposited over the gate electrode 16, the insulating layer 28. The conductive layer is comprised of n-doped polysilicon and has a thickness of between about 2500 and 3500 Å. Alternately an undoped poly is deposited and the ions are implanted to dope the poly.

Figure 8:
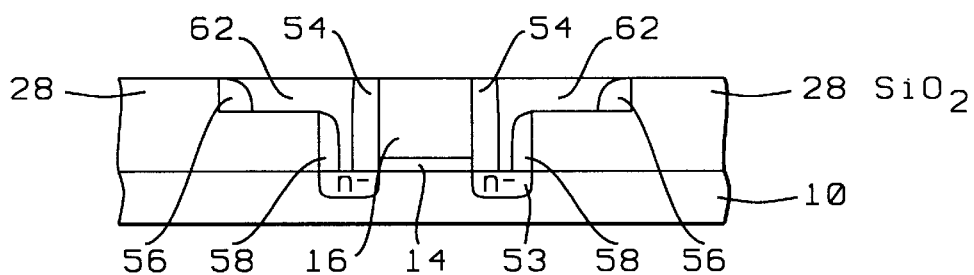

As shown in FIG. 8, we planarize the conductive layer to exposed the insulating layer 28 to form elevated source/drain (S/D) blocks 62 on a staircase shape insulating layer 28. The planarization is preferably a chemical-mechanical polish (CMP) process.

The first embodiment provides the benefits of a highly manufacturable elevated source/drain (S/D) process. The staircase shaped opening is used to define the poly connections to the LDD (shallow). The source/drain (S/D) regions 62 are formed on top of the insulating layer 28 in the opening 40. The structure also provides better punchthru margin for short channel devices.

B. Second Embodiment

The second embodiment of the invention is shown in FIGS. 9 to 13.

Figure 9:
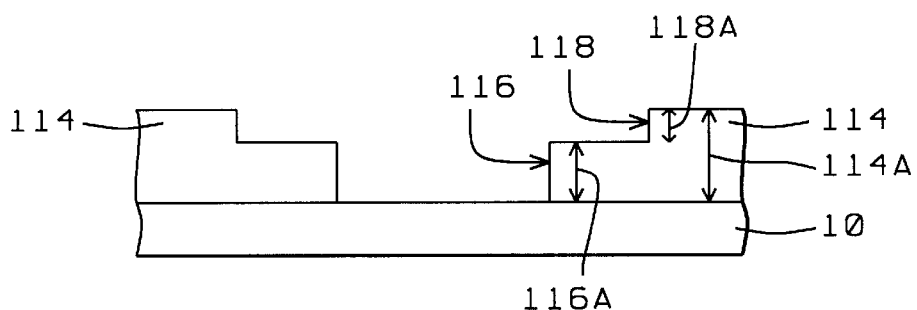
FIGS. 9 through 13 are cross sectional views for illustrating a second preferred embodiment of a method for forming elevated source/drain (S/D) regions in a staircase shaped opening in an insulating layer.

As shown in FIG. 9, an insulating layer 114 having a staircase shaped opening 116 118 is formed over the substrate 10. The staircase shaped opening 116 118 comprised of a lower opening 116 and an upper opening 118. The staircase shaped opening 116 118 can be formed by many different processes as known by those skilled in the art. The staircase shaped opening 116 118 can be defined by any the methods used to define a dual damascene shaped opening, including 2 photoresist step processes, and 1 photoresist layer/etch processes. The insulating layer has first thicknesses 116A between 1000 to 1500 Å, second thickness 118A between 500 and 1000 Å and a overall thickness 114A (116 A and 118A) of between 1500 and 2000 Å.

Next, we form a gate dielectric layer and gate electrode layer over the substrate 10 filling the a staircase shaped opening 116 118. The gate dielectric layer is preferably comprised of oxide.

Figure 10:
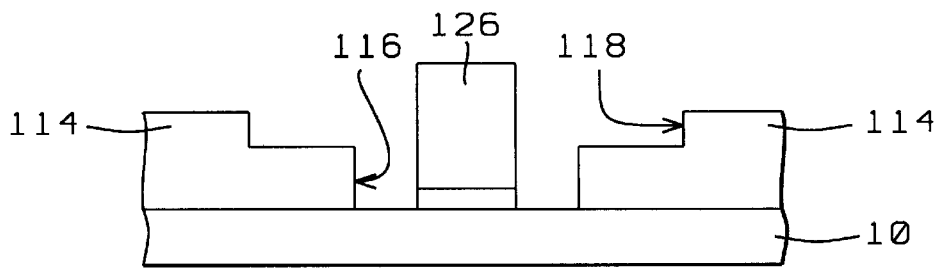

As shown in FIG. 10, we pattern the gate dielectric layer and gate electrode layer to form a gate dielectric 122, and gate electrode 126. The gate dielectric layer and gate electrode layer can be patterned by conventional lithographic processes.

Figure 11:
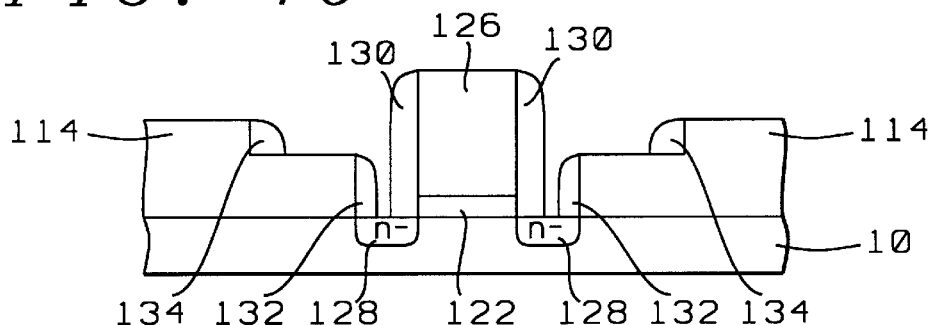

As shown in FIG. 11, ions are implanted into the substrate 10 through the opening 116 and the gate to form LDD regions 128.

Then, we form gate spacers 130 on the sidewalls of the gate electrode 116 and insulating layer spacers 132 134 on the sidewalls of the insulating layer 114 in the staircase shaped opening 116 118. The spacers are formed by forming a blank layer and anisotropically etching the blanket layer. The gate spacers 130 and the insulating layer spacers 132 134 are preferably comprised of oxide.

Figure 12:
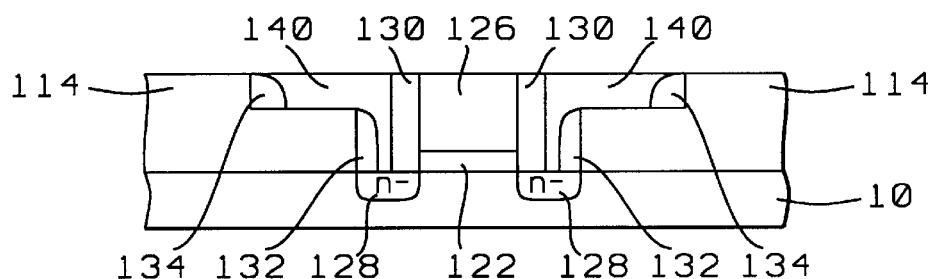

As shown in FIG. 12, we form elevated source/drain (S/D) blocks 140 in the staircase shaped opening 116 118. The elevated source/drain (S/D) blocks 140 are formed in the staircase shaped opening 116 118 by: (a) depositing a polysilicon layer over the substrate and (b) chemical-mechanical polishing (CMP) the polysilicon layer down to the insulating layer 114.

In an optional step, we implant ions into the elevated source/drain (S/D) blocks 140 to dope the elevated source/drain (S/D) blocks 140. Otherwise, the polysilicon layer could be in-situ doped at deposition time.

Figure 13:
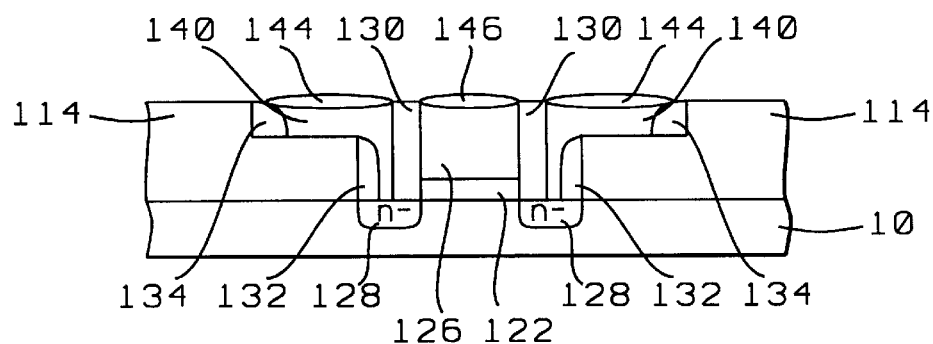

As shown in FIG. 13, we form silicide regions 144 146 on the gate 126 and the elevated source/drain (S/D) blocks 140.

The second embodiment provide benefits of a highly manufacturable elevated source/drain (S/D) process. The staircase shaped opening is used to define the poly connections to the LDD (shallow) and the low resistivity salicide regions 144 146.

As a preface to the detailed description, it should be noted that, as used in this specification and the appended claims, the singular forms "a", "an" and "the" include plural referents, unless the context clearly dictates otherwise. Specific terminology of particular importance to the description of the present invention is defined below.

Within the present invention, the substrate may be a substrate employed within a microelectronics fabrication selected from the group including but not limited to integrated circuit microelectronics fabrications, solar cell microelectronics fabrications, ceramic substrate microelectronics fabrications, optoelectronics device fabrication and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication, Such additional microelectronics layers may include, but are not limited to, microelectronics conductor layers, microelectronics semiconductor layers and microelectronics dielectric layers.

As used in the subject invention, etching refers to chemically eating away a material to form a desired pattern. Selectively etching refers to the use of etching to remove selected portions of one material from another in a semiconductor structure. Selective oxide:nitride etch refers to an etch having a higher etch rate for oxide than for nitride; the selectivity ratio of which indicates the relative etch rates of the respective materials.

Silicon, as used in this application, includes polysilicon (polycrystalline silicon), amorphous silicon (non-crystalline silicon), monocrystalline silicon and silicon/germanium materials. Such silicon may be n- or p-doped, or undoped.

CVD refers to chemical vapor deposition. LPCVD refers to low pressure chemical vapor deposition. Ion implantation refers to the implantation of ions, for example, for doping a semiconductor substrate. Salicidation means formation of self-aligned silicide.

Oxide as used in the subject invention refers to silicon oxides and nitride as used herein refers to silicon nitride. The oxide may be doped or undoped, such as PSG (phosphosilicate glass) or BPSG (Boron doped PSG). An insulation layer or insulator layer refers to a layer having a high resistivity, which does not conduct electricity. It may act as a sodium barrier.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of an elevated Self-Aligned Source/Drain CMOS device on a staircase shaped insulating layer; comprising the steps of:
   a) forming gate structure over a substrate; said gate structure comprised of a gate dielectric layer, gate electrode, first spacers, and hard mask;
   b) forming a first insulating layer over said substrate;
   c) forming a resist layer having an opening over said gate structure and over a lateral area adjacent to said gate structure; said opening is over at least all of said gate structure; said resist layer is not over said gate structure;
   d) etching said first insulating layer through said opening in said resist layer; the etching removing a first thickness of said first insulating layer to form a source/drain (S/D) opening; said source/drain contact open defined by said gate and said first insulating layer;
   e) removing said first spacers and said hardmask to form a source/drain (S/D) contact opening;
   f) implanting ions into said substrate through said source/drain (S/D) contact opening to form lightly doped drain regions;
   g) forming second spacers on the sidewalls of said gate electrode and said gate dielectric and on the sidewalls of said first insulating layer in said source/drain (S/D) contact opening and said source/drain (S/D) opening;

h) depositing a conductive layer over said gate electrode, said first insulating layer; and i) planarizing said conductive layer to exposed said first insulating layer to form elevated source/drain (S/D) blocks on a staircase shape insulating layer.

2. The method of claim 1 wherein said first spacers and said hard mask are comprised of silicon nitride.

3. The method of claim 1 wherein said first insulating layer is comprised of oxide.

4. The method of claim 1 wherein said first insulating layer has a thickness of between about 2000 and 4000 Å.

5. The method of claim 1 wherein said first insulating layer is formed over said substrate and gate structure and said first insulating layer is chemical-mechanical polished to be coplanar with the top of said gate structure to expose the top of said gate structure.

6. The method of claim 1 wherein said first thickness of said insulating layer is between 500 and 1000 Å.

7. The method of claim 1 wherein said second spacers are comprised of silicon oxide and have a thickness of between about 500 and 1000 Å.

8. The method of claim 1 wherein said conductive layer is comprised of n-doped polysilicon and has a thickness of between about 2500 and 3500 Å.

9. A method of fabrication of an elevated Self-Aligned Source/Drain CMOS device on a staircase shaped insulating layer; comprising the steps of:

a) forming gate structure over a substrate; said gate structure comprised of a gate dielectric layer, gate electrode, first spacers, and hard mask;
   (1) said first spacers and said hard mask are comprised of silicon nitride.

b) forming a first insulating layer over said substrate;
   (1) said first insulating layer is comprised of oxide, or a dielectric material with a dielectric constant less than 3.0; said first insulating layer has a thickness of between about 2000 and 4000 Å;
   (2) said first insulating layer is formed over said substrate and gate structure and said first insulating layer is chemical-mechanical polished to be coplanar with the top of said gate structure to expose the top of said gate structure;

c) forming a resist layer having an opening over said gate structure and over a lateral area adjacent to said gate structure; said opening is over at least all of said gate structure; said resist layer is not over said gate structure;

d) etching said first insulating layer through said opening in said resist layer; the etching removing a first thickness of said first insulating layer to form a source/drain (S/D) opening; the etching exposing the top of said gate structure;
   (1) said first thickness of said first insulating layer is between 500 and 1000 Å;

e) removing said first spacers and said hardmask to form a source/drain (S/D) contact opening;

f) implanting ions into said substrate through said source/drain (S/D) contact opening to form lightly doped drain regions;

g) forming second spacers on the sidewalls of said gate electrode and said gate dielectric and on the sidewalls of said first insulating layer in said source/drain (S/D) contact opening and said source/drain (S/D) opening;
   (1) said second spacers are comprised of silicon oxide and have a thickness of between about 500 and 1000 Å;

h) depositing a conductive layer over said gate electrode, and said insulating layer;
   (1) said conductive layer is comprised of n-doped polysilicon and has a thickness of between about 2500 and 3500 Å;

i) planarizing said conductive layer to exposed said first insulating layer to form elevated source/drain (S/D) blocks on a staircase shape insulating layer.

* * * * *